United States Patent
Chen et al.

(10) Patent No.: US 9,341,873 B2
(45) Date of Patent: May 17, 2016

(54) MANUFACTURING METHOD OF A FLEXIBLE DISPLAY PANEL COMPRISING A CONTACT HOLE FORMED IN A BUFFER LAYER

(71) Applicant: Au Optronics Corporation, Hsinchu (TW)

(72) Inventors: Yung-Pei Chen, Taichung (TW); Chun-Hsiang Fang, Yilan County (TW); Chih-Hung Tsai, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 46 days.

(21) Appl. No.: 14/098,455

(22) Filed: Dec. 5, 2013

(65) Prior Publication Data
US 2014/0375916 A1    Dec. 25, 2014

(30) Foreign Application Priority Data
Jun. 25, 2013    (TW) .............................. 102122587 A

(51) Int. Cl.
*G02F 1/1343*    (2006.01)
*G02F 1/1333*    (2006.01)
*G02F 1/1345*    (2006.01)
*G02F 1/1362*    (2006.01)
(Continued)

(52) U.S. Cl.
CPC ........ *G02F 1/133305* (2013.01); *G02F 1/1345* (2013.01); *G02F 1/136286* (2013.01); *H01L 27/124* (2013.01); *H01L 27/1218* (2013.01); *H01L 27/1266* (2013.01); *H01L 27/3276* (2013.01); *H01L 29/78603* (2013.01); *H01L 51/003* (2013.01); *H01L 2227/323* (2013.01); *H01L 2227/326* (2013.01); *H01L 2251/5338* (2013.01)

(58) Field of Classification Search
CPC .... H01L 27/32; H01L 27/1218; H01L 51/003
USPC .......................................................... 349/38
See application file for complete search history.

(56) References Cited

U.S. PATENT DOCUMENTS 7,253,087 B2    8/2007    Utsunomiya
7,342,354 B2    3/2008    Utsunomiya et al.
(Continued)

FOREIGN PATENT DOCUMENTS

CN    101231972    7/2008
CN    102903858    1/2013
(Continued)

*Primary Examiner* — Paul Lee
(74) *Attorney, Agent, or Firm* — Jianq Chyun IP Office

(57) ABSTRACT

A flexible display panel including a buffer layer, an active element, a pad, a display device and a signal transmission circuit is provided. The active element is located on the buffer layer. The pad is located in the buffer layer and is electrically connected to the active element. The display device is located on the active element and is electrically connected to the active element, in which the display device includes a pixel electrode, an opposite electrode and a display medium layer located therebetween. The active element and the signal transmission circuit are respectively located at a first surface and a second surface of the buffer layer, the second surface is opposite to the first surface, and the signal transmission circuit is electrically connected to the active element via the pad. A manufacturing method of a flexible display panel is also provided.

3 Claims, 9 Drawing Sheets

(51) Int. Cl.
  *H01L 27/12* (2006.01)
  *H01L 27/32* (2006.01)
  *H01L 29/786* (2006.01)
  *H01L 51/00* (2006.01)

(56) References Cited

U.S. PATENT DOCUMENTS

| | | | |
|---|---|---|---|
| 7,825,582 | B2 | 11/2010 | Furukawa et al. |
| 7,977,176 | B2 | 7/2011 | Oh |
| 8,063,856 | B2 | 11/2011 | Sarma et al. |
| 8,188,474 | B2 | 5/2012 | Hatano et al. |
| 8,198,148 | B2 | 6/2012 | Koo et al. |
| 8,211,725 | B2 | 7/2012 | Park et al. |
| 8,692,256 | B2 | 4/2014 | Noda et al. |
| 9,070,897 | B2 | 6/2015 | Huang et al. |
| 2004/0245924 | A1 | 12/2004 | Utsunomiya et al. |
| 2008/0179594 | A1 | 7/2008 | Oh |
| 2008/0225190 | A1* | 9/2008 | Chen et al. ............... 349/38 |
| 2010/0007829 | A1* | 1/2010 | Oikawa ............ G02F 1/133305 349/122 |
| 2013/0026478 | A1 | 1/2013 | Noda et al. |
| 2013/0044046 | A1 | 2/2013 | Huang et al. |

FOREIGN PATENT DOCUMENTS

| | | |
|---|---|---|
| TW | 200427362 | 12/2004 |
| TW | I287298 | 9/2007 |
| TW | I288493 | 10/2007 |
| TW | I302423 | 10/2008 |
| TW | I316753 | 11/2009 |
| TW | 201113843 | 4/2011 |
| TW | I368801 | 7/2012 |
| TW | 201308557 | 2/2013 |

* cited by examiner

MANUFACTURING METHOD OF A FLEXIBLE DISPLAY PANEL COMPRISING A CONTACT HOLE FORMED IN A BUFFER LAYER

CROSS-REFERENCE TO RELATED APPLICATION

This application claims the priority benefit of Taiwan application serial no. 102122587, filed on Jun. 25, 2013. The entirety of the above-mentioned patent application is hereby incorporated by reference herein and made a part of this specification.

BACKGROUND

1. Field of the Invention

The disclosure relates to a display panel and a manufacturing method thereof, and more particularly, to a flexible display panel and a manufacturing method thereof.

2. Description of Related Art

With rapid development of display technologies, conventional cathode ray tube (CRT) displays have been gradually replaced by flat panel displays (FPD). In comparison with the FPD formed by a rigid substrate (e.g. a glass substrate), a flexibly display in which an active element is formed on a flexible substrate has been developed according to recent researches because the flexible substrate (e.g. a plastic substrate) is characterized by flexibility and impact endurance.

The manufacturing method of flexible display panel can be divided into a roll-to-roll process and a process that adhering a flexible substrate to a rigid substrate. In terms of the flexible display panel manufacturing method that uses the rigid substrate to serve as a carrier, how to release the flexible substrate from the rigid substrate to separate the flexible substrate and the rigid substrate away from each other determines the manufacturing throughput and yield of the flexible display panel, after the process of display unit is completed.

Currently, the manufacturing method of flexible display panel includes attaching the flexible substrate onto the rigid substrate and then executing the manufacturing processes of active element and display device on the flexible substrate. Until the active element and the display device are manufactured, the flexible substrate which the active element and the display device formed thereon is removed from the rigid substrate so as to connect with the signal transmission circuit. Since the flexible substrate is directly fabricated on the rigid substrate, the circumstances such disconnection or crack are likely to occur due to stress while releasing from the rigid substrate, thereby causing the manufacturing yield to decrease. Furthermore, when the flexible substrate is a plastic substrate, the fabrication of active element and display device on the flexible substrate are easy to be restricted by the process temperature of the plastic substrate, such that the performance of the device is affected.

Moreover, the flexible substrate usually requires connecting with the signal transmission circuit via the pads located thereon, such that the flexible display panel is then able to function. If the release between the flexible substrate and the rigid substrate is performed after the flexible substrate is connected with the signal transmission circuit, the peeling issue between the flexible substrate and the signal transmission circuit is likely to occur. On the other hand, the flexible substrate is also able to connect with the signal transmission circuit after the flexible substrate is released from the rigid substrate. However, after the flexible substrate is released from the rigid substrate and before connecting with the signal transmission circuit, a protective film is usually adhered to a surface of the flexible substrate, so as to prevent dust particles from the environment to stick on the flexible substrate which causes the circuits or the elements on the flexible substrate to disconnect or crack. As such, during the flexible substrate is connected with the signal transmission circuit, the protective film has to expose the pads on the flexible substrate beforehand. By this way, besides the manufacturing steps become rather complicated, the manufacturing yield is also easily affected when the protective film is adhered and torn off repeatedly.

SUMMARY OF THE DISCLOSURE

The disclosure is directed to a flexible display panel having a preferable reliability.

The disclosure is directed to a manufacturing method of a flexible display panel having a relatively simplified manufacturing procedure.

The disclosure provides a flexible display panel, which includes a buffer layer, an active element, a pad, a display device and a signal transmission circuit. The active element is located on the buffer layer. The pad is located in the buffer layer and is electrically connected to the active element. The display device is located on the active element and is electrically connected to the active element, in which the display device includes a pixel electrode, an opposite electrode and a display medium layer located between the pixel electrode and the opposite electrode. The active element and the signal transmission circuit are respectively located at a first surface and a second surface of the buffer layer, the second surface is opposite to the first surface, and the signal transmission circuit is electrically connected to the active element via the pad.

According to an embodiment of the disclosure, the pad and the display device are separated.

According to an embodiment of the disclosure, the display medium layer and the pad are separated.

According to an embodiment of the disclosure, the buffer layer has a first contact hole, the pad is located in the first contact hole, and the signal transmission circuit is electrically connected to the active element via the pad.

According to an embodiment of the disclosure, the display medium layer includes an organic electroluminescent layer or a liquid crystal layer.

According to an embodiment of the disclosure, the pad includes a plurality of stacked conductive layers.

According to an embodiment of the disclosure, the signal transmission circuit includes a flexible printed circuit board.

According to an embodiment of the disclosure, the flexible display panel further includes an insulating layer located on the active element, in which the insulating layer has a second contact hole and the active element is electrically connected to the display device via the second contact hole.

According to an embodiment of the disclosure, the pad has a third surface and a fourth surface, in which the third surface and the first surface are located on a same side of the buffer layer, the fourth surface and the second surface are located on a same side of the buffer layer, the active element is in contact with the third surface and the signal transmission circuit is in contact with the fourth surface.

The disclosure provides a manufacturing method of a flexible display panel, which includes the following steps. Firstly, a buffer layer is formed on a carrier substrate. Next, an active element is formed on the buffer layer, and a pad is formed in the buffer layer during the formation of the active element, so that the pad is electrically connected to the active element. Subsequently, a display device electrically connected to the active element is formed on the active element, in which the display device includes a pixel electrode, an opposite electrode and a display medium layer located between the pixel electrode and the opposite electrode. Then, the buffer layer is separated from the carrier substrate to expose the pad. The pad is caused to electrically connect to a signal transmission circuit.

According to an embodiment of the disclosure, the formation of the pad includes the following steps. A first contact hole is formed in the buffer layer. A conductive material is filled into the first contact hole so as to form the pad in the first contact hole.

According to an embodiment of the disclosure, before the buffer layer is formed on the carrier substrate, a release layer is further formed on the carrier substrate, and the pad is in contact with the release layer.

According to an embodiment of the disclosure, the manufacturing method of the flexible display panel further includes removing the release layer to separate the carrier substrate and the buffer layer.

According to an embodiment of the disclosure, before forming the display device, an insulating layer is further formed on the active element, in which the insulating layer has a second contact hole, and the active element is electrically connected to the display device via the second contact hole.

To recapitulate, in the embodiments of the disclosure, the processes of manufacturing the active element, the display device and the pad on the carrier substrate (such as the glass substrate) are not restricted by the process temperature of the flexible substrate. Additionally, since the flexible display panel is connected to the signal transmission circuit after releasing from the carrier substrate during the manufacturing process thereof; the issue related to the signal transmission circuit peeling from the flexible display panel can be prevented while releasing, such that the flexible display panel has a preferable reliability. Moreover, in the disclosure, the pad is exposed after releasing from the carrier substrate, which can be connected to the signal transmission circuit directly in the manufacturing method of the flexible display panel. Thus, the manufacturing method of the flexible display panel has a relatively simplified manufacturing procedure.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

First Embodiment

Figure 1A:
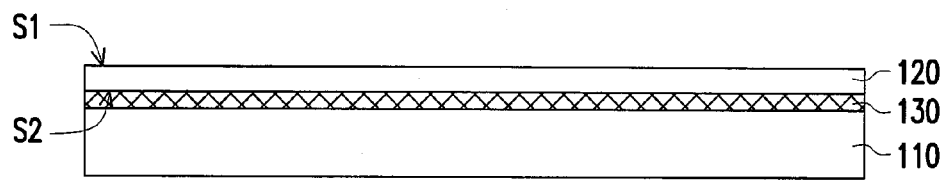
FIG. 1A through FIG. 1I are schematic diagrams illustrating a manufacturing process of a flexible display panel in a cross-sectional view according to a first embodiment of the disclosure.

FIG. 1A through FIG. 1I are schematic diagrams illustrating a manufacturing process of a flexible display panel in a cross-sectional view according to a first embodiment of the disclosure. Referring to FIG. 1A, a buffer layer 120 is formed on the carrier substrate 110. The buffer layer 120 has a first surface S1 and a second surface S2 opposite to the first surface S1, in which the second surface S2 is located between the first surface S1 and the carrier substrate 110, for instance. In the embodiment, the carrier substrate 110 can be configured to be a carrier for carrying the subsequent manufactured devices. For example, the material of the carrier 110 can be glass, quartz, polyester, polycarbonate or other materials with a certain rigidity. On the other hand, the buffer layer 120 can be configured to block the impurities contained in the carrier substrate 110 to diffuse. For example, the material of the buffer layer 120 can be silicon oxide or silicon nitride with high dielectric coefficient.

In the embodiment, the carrier substrate 110 can be served as a temporary substrate. In other words, the carrier substrate 110 has to be able to release from the buffer layer 120 after completing the fabrication of the subsequent devices. Therefore, a release layer 130 can be further formed on the carrier substrate 110 before forming the buffer layer 120 on the carrier substrate 110, in the embodiment. Namely, the release layer 130 and the buffer layer 120 are sequentially formed on the carrier substrate 110 in the embodiment, in which the release layer 130 is located between the carrier substrate 10 and the buffer layer 120. Additionally, the release layer 130 of the embodiment can be an amorphous silicon (a-Si) semiconductor layer, although the disclosure is not limited thereto. In other embodiments, the release layer 130 can also be a photosensitive gel.

Figure 1B:
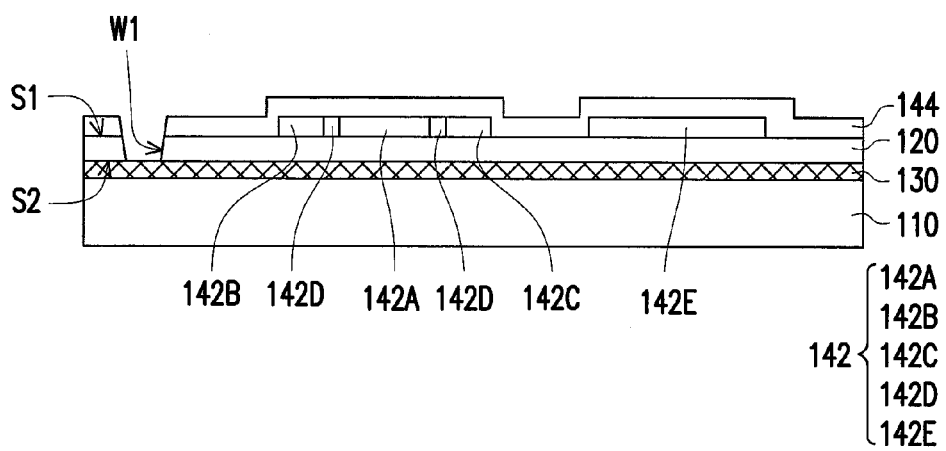

Referring to FIG. 1B, a polysilicon layer 142 and a gate insulation layer 144 are sequentially formed on the buffer layer 120. In the embodiment, the polysilicon layer 142 includes a channel region 142A, a source region 142B, a drain region 142C, low-doped regions 142D and a lower electrode 142E, in which the channel region 142A is located between the source region 142B and the drain region 142C, the low-doped regions 142D are located between the channel region 142A and the source region 142B and between the channel region 142A and the drain region 142C. The channel region 142A, the source region 142B, the drain region 142C and the low-doped regions 142D are connected to each other to form island structures. Moreover, the lower electrode 142E is located beside the island structures, and is separated from the island structures. Namely, the lower electrode 142E of the embodiment is not in direct contact with the island structures, although the disclosure is not limited thereto. In other embodiments, the lower electrode 142E can be in direct contact with the island structures.

In the embodiment, the method for forming the source region 142B, the drain region 142C, the low-doped regions 142D and the lower electrode 142E is, for instance, to implant dopants into the afore-described regions using ion implantation, in which the type of the implanted dopants (such as a p-type dopant or a n-type dopant) and the amount of dopants being implanted depend on a design requirement. Such method is known to those skilled persons in the art, which is not repeated therein.

Subsequently, a first contact hole W1 is formed in the buffer layer 120 so as to expose a portion of the release layer 130. Since the gate insulation layer 144 is covered on the buffer layer 120 while forming the first contact hole W1, the first contact hole W1 of the embodiment is formed in the buffer layer 120 and the gate insulation layer 144.

Figure 1C:
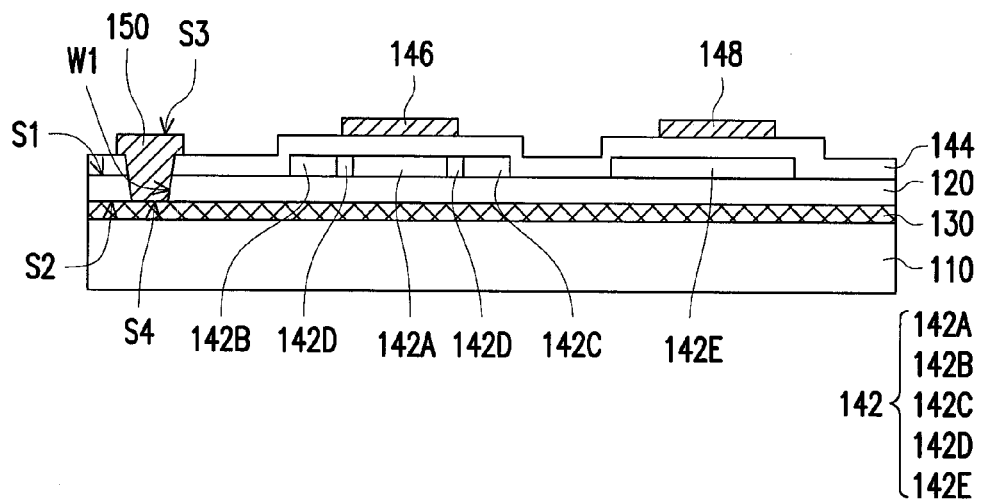

Referring to FIG. 1C, a pad 150 is formed in the first contact hole W1, and a gate 146 and an upper electrode 148 are formed on the gate insulation layer 144, in which the gate 146 is located above the channel region 142A, the upper electrode 148 is located above the lower electrode 142E and the pad 150 is disposed on the release layer 130 via the first contact hole W1. Specifically, the pad 150 has a third surface S3 and a fourth surface S4 opposite to the third surface S3, in which the third surface S3 and the first surface S1 are located on a same side of the buffer layer 120, and the fourth surface S4 and the second surface S2 are located on a same side of the buffer layer 120 as, for instance.

The pad 150, the gate 146 and the upper electrode 148 can be formed simultaneously in the embodiment. In addition, the method of forming the pad 150 in the embodiment is, for instance, to fill a conductive material (that is the same material as the gate 146 and the upper electrode 148) into the first contact hole W1. The conductive material can be molybdenum (Mo), aluminum (Al), titanium (Ti) and other metal materials or alloys thereof. In another embodiment, the pad 150 can also be a plurality of stacked conductive layers, and the material of the conductive layers can be selected from at least two of the afore-described conductive materials, for instance.

Figure 1D:
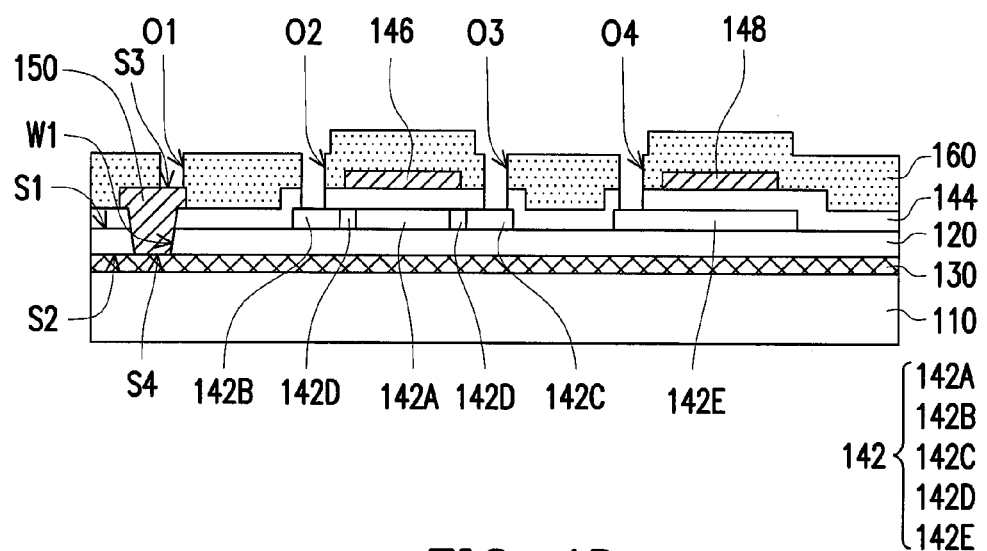

Next, as shown in FIG. 1D, interlayer dielectric (ILD) layers 160 are formed on the gate insulation layer 144, the pad 150, the gate 146 and the upper electrode 148, in which a first opening O1 is formed in the ILD layers 160, a second opening O2, a third opening O3 and a fourth opening O4 are formed in the gate insulation layer 144 and the ILD layers 160. The pad 150 is exposed by the first opening O1, the source region 142B is exposed by the second opening O2, the drain region 142C is exposed by the third opening O3 and the lower electrode 142E is exposed by the fourth opening O4.

Figure 1E:
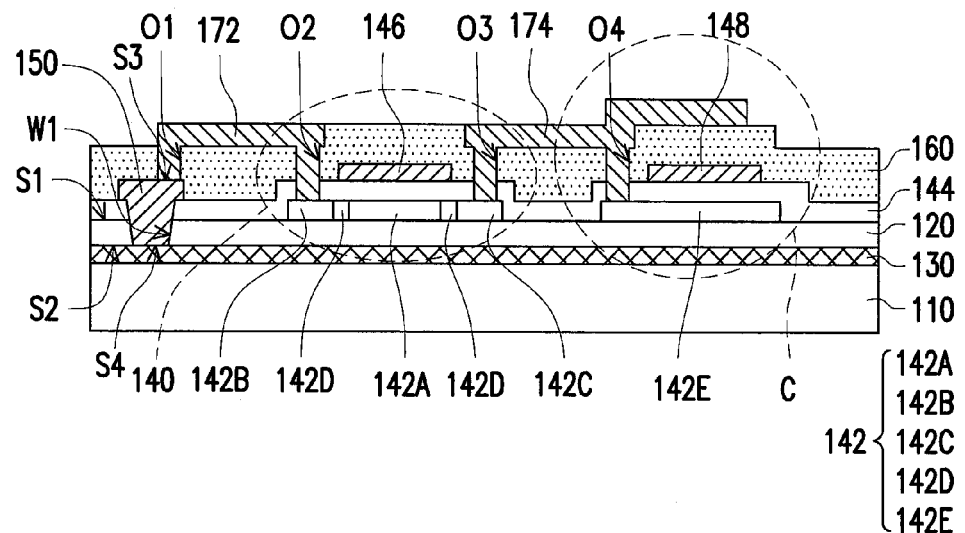

Thereafter, as shown in FIG. 1E, a first electrode pattern 172 and a second electrode pattern 174 are formed on the ILD layers 160. The first electrode pattern 172 is electrically connected to the pad 150 and the source region 142B via the first opening O1 and the second opening O2. The second electrode pattern 174 is electrically connected to the drain region 142C and the lower electrode 142E via the third opening O3 and the fourth opening O4. In the embodiment, the second electrode pattern 174 can further extend onto the ILD layer 160 above the upper electrode 148.

Hereupon, the fabrication of the active element 140 is completed, in which the active element 140 is located on the buffer layer 120, and the active element 140 includes the channel region 142A, the source region 142B, the drain region 142C, the low-doped regions 142D, the gate insulation layer 144, the gate 146, the first electrode pattern 172 and the second electrode pattern 174.

It should be noted that the active element 140 of the embodiment is employed a low temperature poly-silicon thin film transistor (LTPS TFT) for illustration, although the type of the active element is not limited in the disclosure. In other embodiments, the active element can also be an amorphous silicon TFT (a-Si TFT), a microcrystalline silicon TFT (micro-Si TFT) or a metal oxide transistor (oxide TFT) etc.

In the embodiment, the pad 150 is formed together during the formation of the active element 140. For example, the pad 150 and the gate 146 are formed simultaneously although the disclosure is not limited thereto.

Additionally, in the embodiment, a storage capacitor C is further formed beside the active element 140. Specifically, the upper electrode 148, the lower electrode 142E and the second electrode pattern 174 extended above the upper electrode 148 are electrically coupled to form a multi-layered storage capacitor C. The gate insulation layer 144 is disposed between the upper electrode 148 and the lower electrode 142E, and the ILD layer 160 is disposed between the upper electrode 148 and the second electrode pattern 174 extended above the upper electrode 148.

Figure 1F:
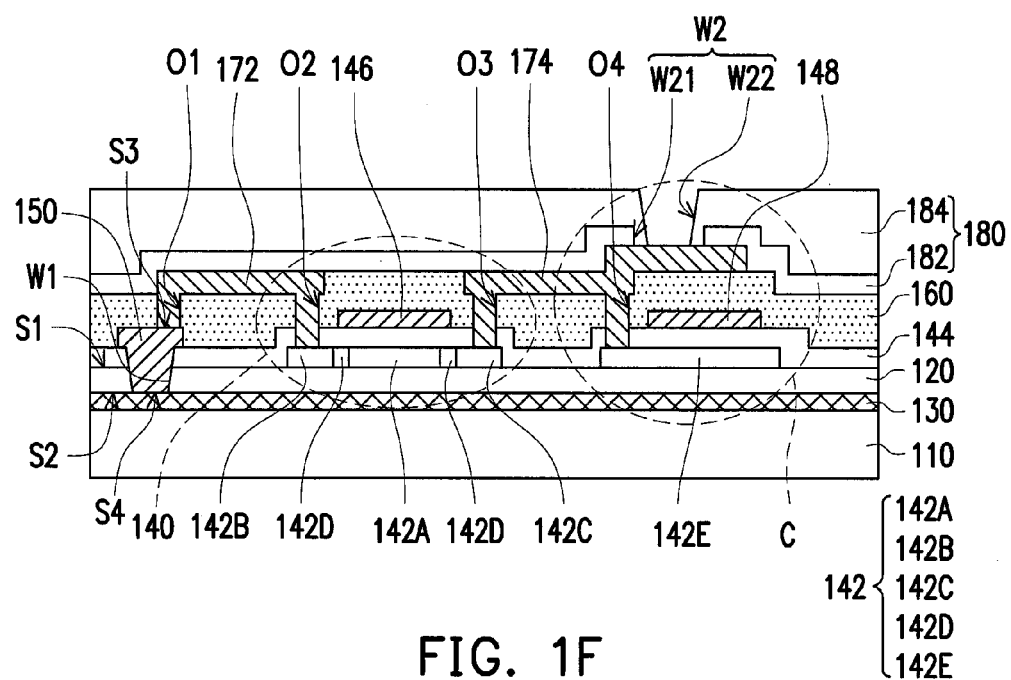

Referring to FIG. 1F, an insulating layer 180 is formed on the active element 140, in which the insulating layer 180 has a second contact hole W2, and the second electrode pattern 174 of the active element 140 is exposed by the second contact hole W2. Specifically, the insulating layer 180 of the embodiment can be constituted of a dielectric layer 182 and a planarization layer 184 although the disclosure is not limited thereto, in which the dielectric layer 182 and the planarization layer 184 can be sequentially formed on the active element 140, and the dielectric layer 182 is located between the active element 140 and the planarization layer 184. Moreover, the dielectric layer 182 has a contact hole W21 and the planarization layer 184 has a contact hole W22. In the embodiment, a portion of the planarization layer 184 is located in the contact hole W21. Namely, the planarization layer 184 is formed on the dielectric layer 182 after the contact hole W21 is formed, and then the contact hole W22 is formed. However, in other embodiments, the contact holes W21 and W22 can also be formed simultaneously. Namely, the dielectric layer 182 and the planarization layer 184 are firstly formed, and the contact holes W21 and W22 are formed afterwards.

Figure 1G:
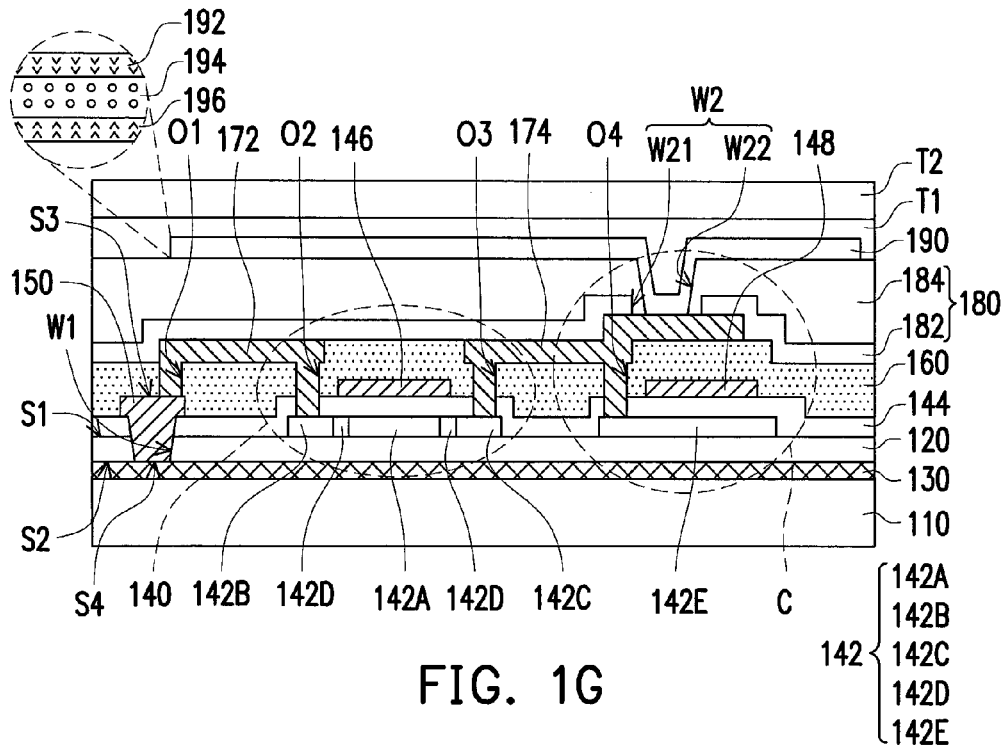

Referring to FIG. 1G, a display device 190 is formed on the active element 140, in which the display device 190 and the pad 150 are structurally separated. Specifically, the display device 190 of the embodiment is located on the planarization layer 184, and is electrically connected to the active element 140 via the second contact hole W2. To be more specific, the display device 190 of the embodiment is electrically connected to the second electrode pattern 174 of the active element 140.

As shown in the enlarged diagram of FIG. 1G, the display device 190 includes a pixel electrode 196, an opposite electrode 192 and a display medium layer 194 located between the pixel electrode 196 and the opposite electrode 192. In the embodiment, the display device 190 is employed an organic light emitting diode (OLED) for illustration. Specifically, the display medium layer 194 of the embodiment may include an organic light emitting layer and other layers required in an organic light emitting diode (such as an electron/hole transport layer or an electron/hole injection layer etc.). In another embodiment, the display device 190 can also be a liquid crystal display device or an electrophoretic display device. Namely, the material of the display medium layer can also be liquid crystal or electrophoretic, in which the liquid crystal can be twisted nematic liquid crystal (TN LC), super twisted nematic liquid crystal (STN LC) or cholesteric liquid crystal (CLC). Here, the display medium layer 194 is disposed between the pixel electrode 192 and the opposite electrode 196 without being in contact with the pad 150.

Moreover, a thin film encapsulation (TFE) layer T1 and a first passivation layer T2 can be further sequentially formed on the display device 190 and the insulating layer 180, in which the first passivation layer T2 can be formed on the TFE layer T1 through adhesion.

Figure 1H:
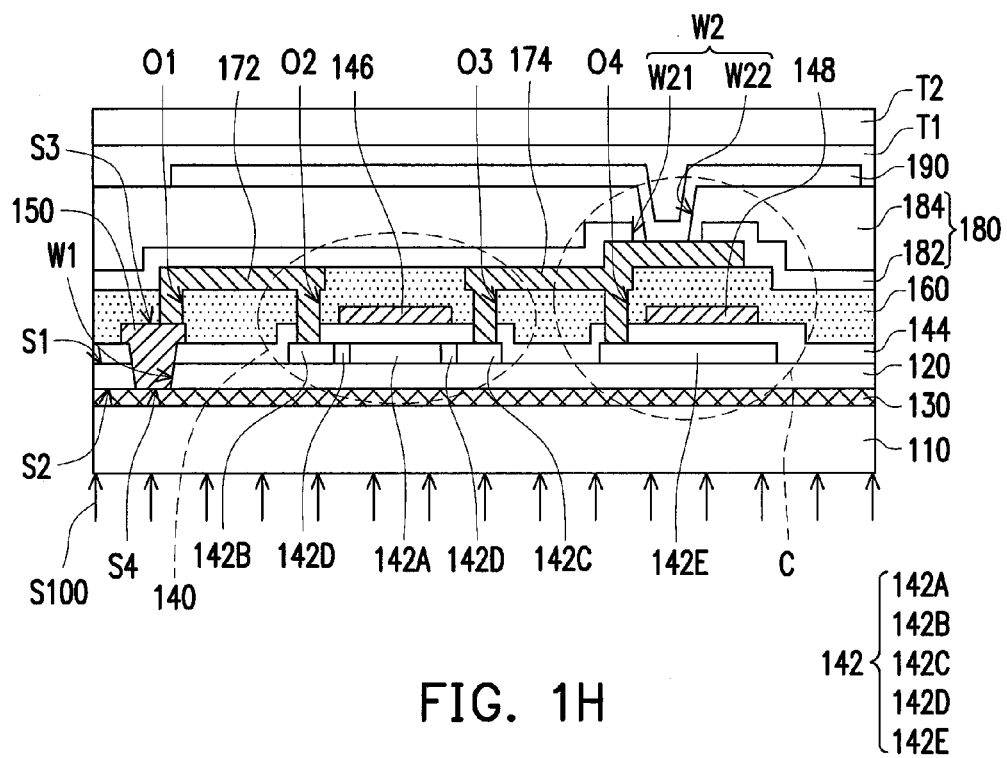

Referring to FIG. 1H, the carrier substrate 110 is caused to separate from the buffer layer 120 so as to expose the pad 150. In the embodiment, the method for separating the carrier substrate 110 from the buffer layer is to remove the release layer 130 using a laser lift-off process 5100 thereby separating the carrier substrate 110 and the buffer layer 120 apart from each other, for instance. However, the method for separating the carrier substrate 110 and the buffer layer 120 can be varied depending on the material of the release layer 130, and thus the separation method of the carrier substrate 110 and the buffer layer 120 is not limited in the disclosure.

Figure 1I:
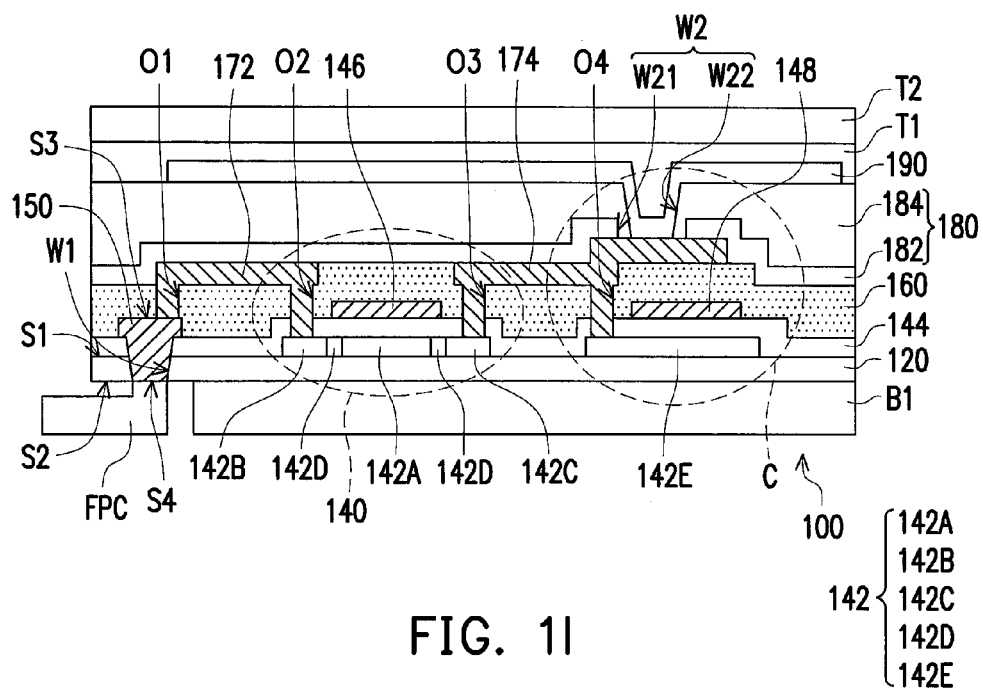

Referring to FIG. 1I, the pad 150 is caused to electrically connect to the signal transmission circuit FPC. In the embodiment, the signal transmission circuit FPC is, for instance, a flexible printed circuit board which is adapted to connect two electronic devices or connect an electronic device and a chip together so as to drive the electronic device (such as driving a flexible display panel). To be more specific, the signal transmission circuit FPC can be electrically connected to the active element 140 via the pad 150 in the embodiment. In addition, the signal transmission circuit FPC and the active element 140 are respectively located at the two opposite surfaces of the buffer layer 120. Specifically, the active element 140 is located on the first surface S1 of the buffer layer 120, while the signal transmission circuit FPC is located on the second surface S2 of the buffer layer 120. Moreover, the active element 140 is in contact with the third surface S3 of the pad 150, and the signal transmission circuit FPC is in contact with the fourth surface S4 of the pad 150.

Moreover, after the carrier substrate 110 and the buffer layer 120 are separated, a second passivation layer B1 can be further formed on the second surface S2 of the buffer layer 120 in the embodiment, in which the pad 150 is exposed by the second passivation layer B1 so that the signal transmission circuit FPC can be electrically connected to the pad 150. Hereupon, the flexible display panel 100 of the embodiment is preliminary completed.

In the embodiment, the active element 140, the display device 190 and the pad 150 are fabricated on the carrier substrate (such as the glass substrate), and thus the afore-described devices are not restricted by the process temperature during the manufacturing processes, and have preferable device characteristics. Furthermore, the stress caused by the difference between the thermal expansion coefficients may not exist on the plastic substrate in the embodiment, such that the flexible display panel 100 of the embodiment is capable of having a preferable reliability and a preferable yield. Moreover, since the active element 140 and the pad 150 are fabricated on the buffer layer 120 and the buffer layer 120 is separated from the carrier substrate 110 through the laser lift-off process, issues such as the adhesive force and the stress between the flexible substrate and the carrier substrate can be neglected during release, and the occurrences of crack or disconnection due to the stress can be avoided, thereby further enhancing the manufacturing yield of the flexible display panel 100. Moreover, the pad 150 is exposed after releasing from the carrier substrate 110, which can be connected to the signal transmission circuit FPC directly. As such, besides the manufacturing yield affected by adhering and tearing off the conventional protective film repeatedly can be improved, the manufacturing method of the flexible display panel 100 in the embodiment can have a relatively simplified manufacturing procedure.

Second Embodiment

FIG. 2A through FIG. 2I are schematic diagrams illustrating a manufacturing process of a flexible display panel in a cross-sectional view according to a second embodiment of the disclosure. It should be noted that portions of the detailed implementation of manufacturing processes in the following embodiment are similar to those disclosed by the afore-described embodiment, so that the detailed description may be referred to the descriptions above, which is not repeated therein. The difference between the first embodiment and the second embodiment is the structure of the pad 150A, the gate 146A and the upper electrode 148A depicted in FIG. 2C and the manufacturing method thereof.

Figure 2A:
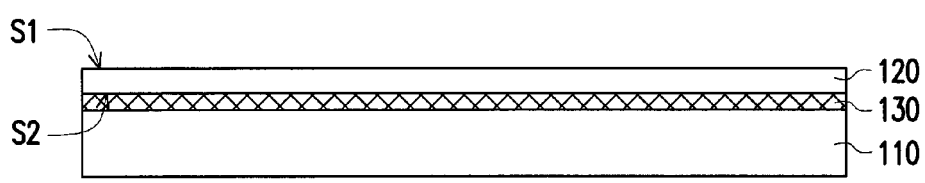
FIG. 2A through FIG. 2I are schematic diagrams illustrating a manufacturing process of a flexible display panel in a cross-sectional view according to a second embodiment of the disclosure.
Figure 2B:
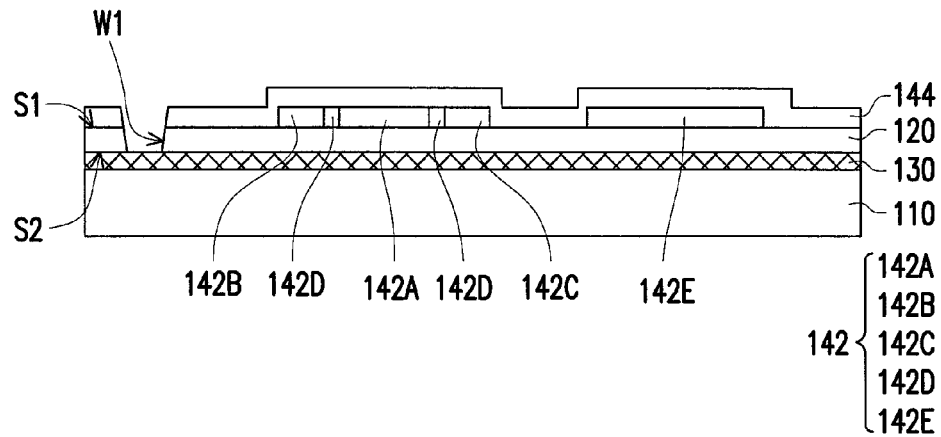
Figure 2C:
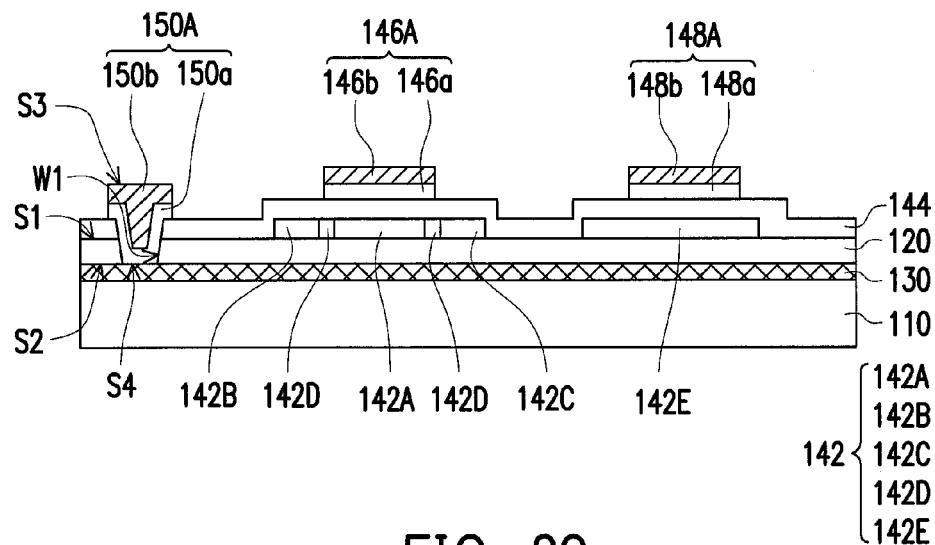
Figure 2D:
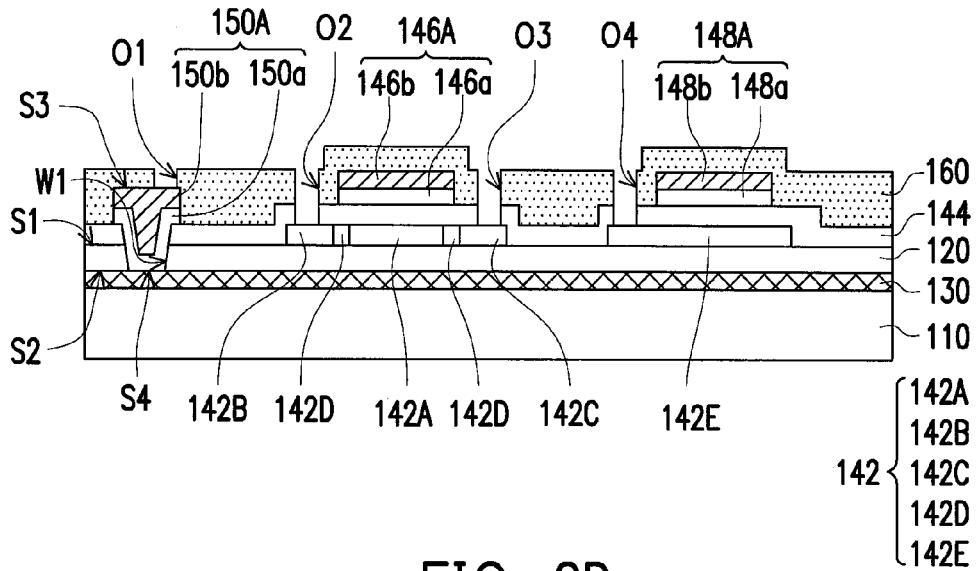
Figure 2E:
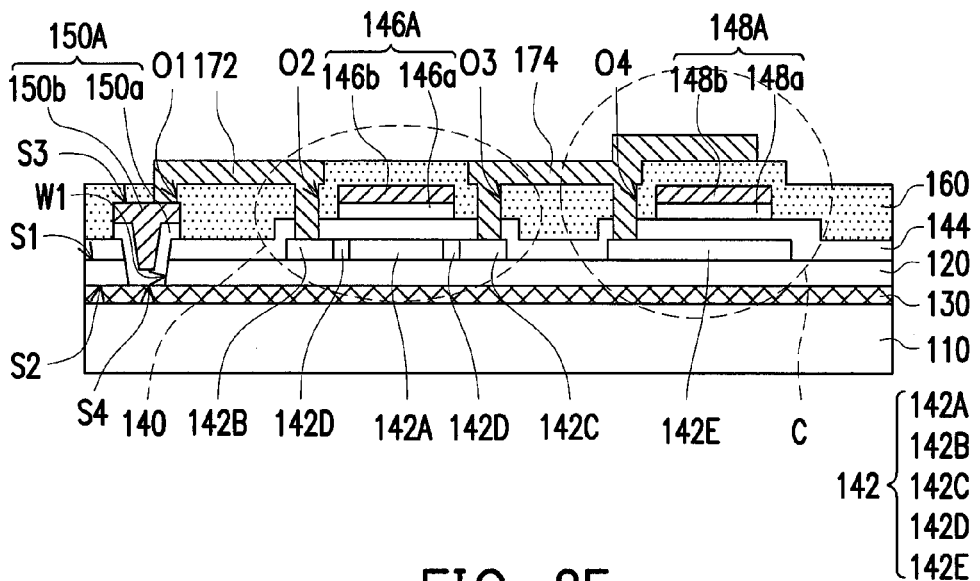
Figure 2F:
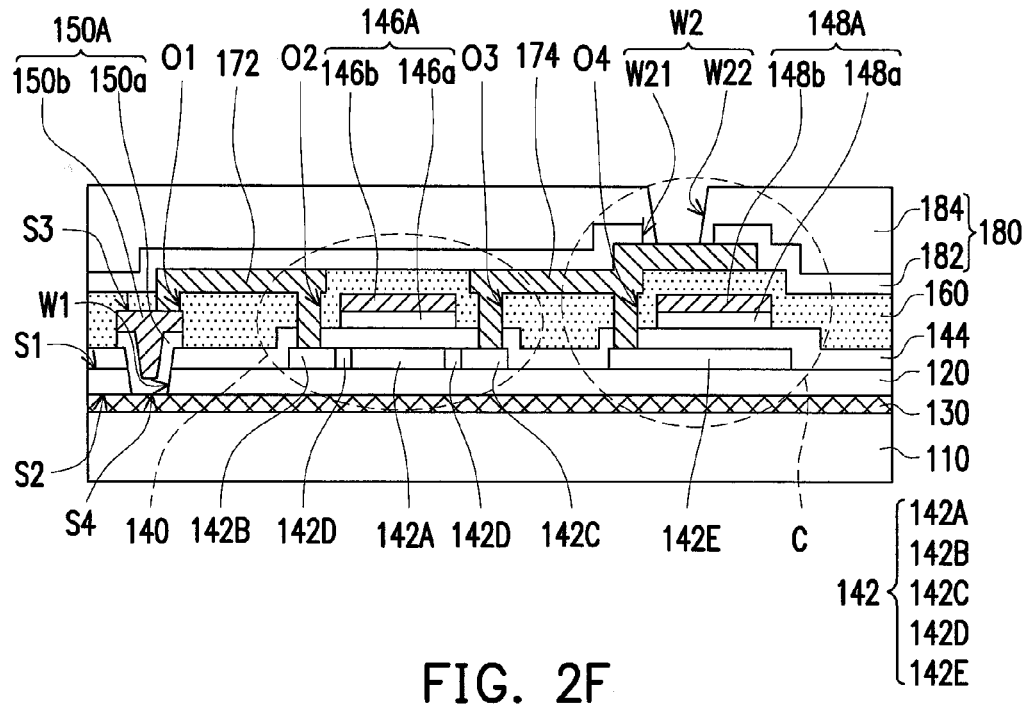

Referring to FIG. 2C, the pad 150A, the gate 146A and the upper electrode 148A in the embodiment are respectively formed by stacking the first conductive layer and the second conductive layer together. For instance, the formation thereof is to sequentially form the first conductive layer and the second conductive layer on the buffer layer 120 and in the first contact hole W1, and then the pad 150A, the gate 146A and the upper electrode 148A are formed through performing a patterning process, in which the pad 150A includes a first conductive layer 150a and a second conductive layer 150b, the gate 146A includes a first conductive layer 146a and a second conductive layer 146b, and the upper electrode 148A includes a first conductive layer 148a and a second conductive layer 148b.

In the embodiment, the material of the first conductive layers 150a, 146a and 148a can be a metal oxide, such as indium tin oxide (ITO), indium zinc oxide (IZO), aluminum zinc oxide (AZO), aluminum tin oxide (ATO), indium tin zinc oxide (ITZO), other suitable materials. Alternatively, the first conductive layers 150a, 146a and 148a can be a stacked layer including at least two of the afore-described materials. On the other hand, the material of the second conductive layers 150b, 146b and 148b can be molybdenum, aluminum, titanium and other metal materials or alloys thereof. Alternatively, the second conductive layers 150b, 146b and 148b can be a stacked layer including at least two of the afore-described materials. Due to the first conductive layers 150a, 146a, 148a has a preferable corrosion resistance and characteristics of being waterproof and oxygen proof, the reliability of the flexible display panel 200 can be further enhanced through the configuration of the first conductive layers 150a, 146a, 148a.

Figure 2G:
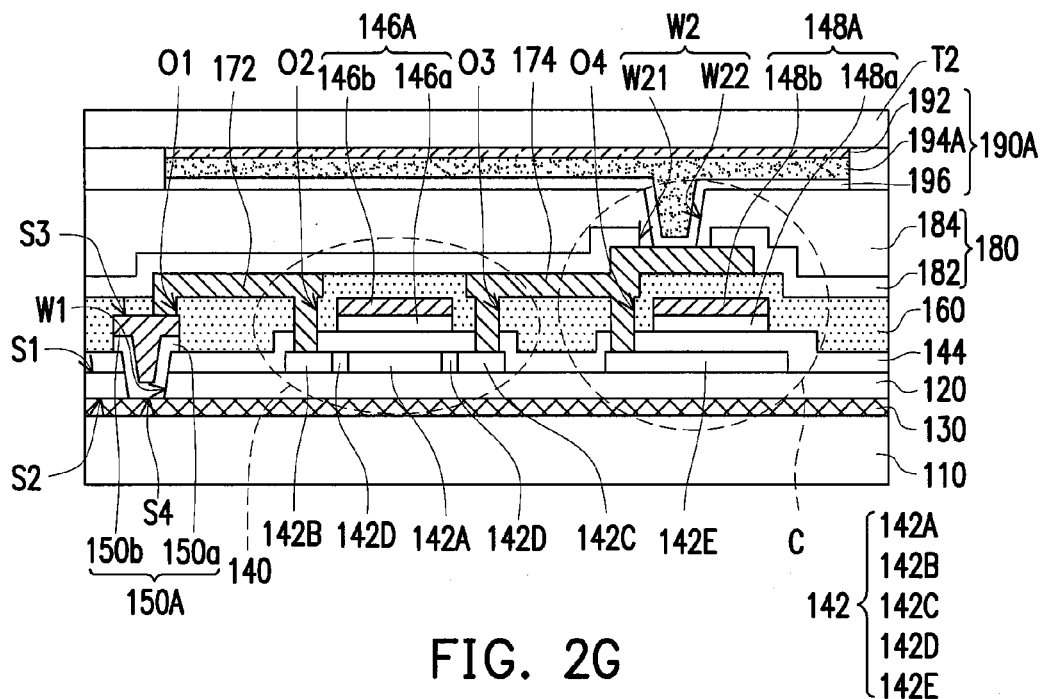
Figure 2H:
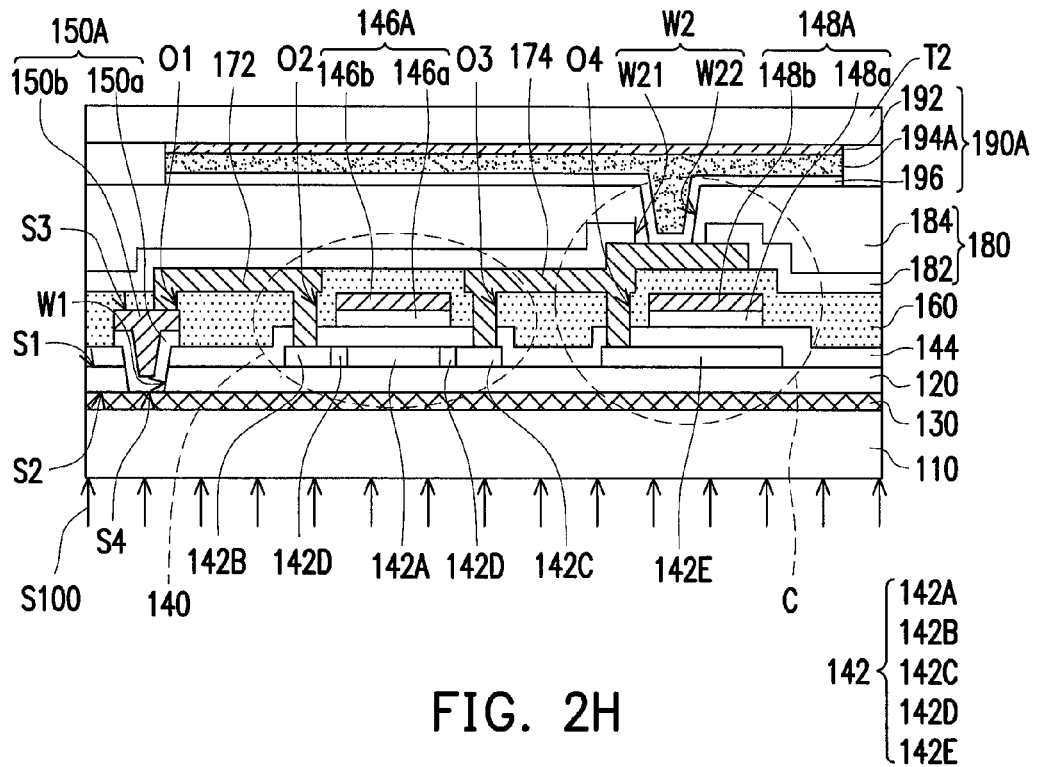
Figure 2I:
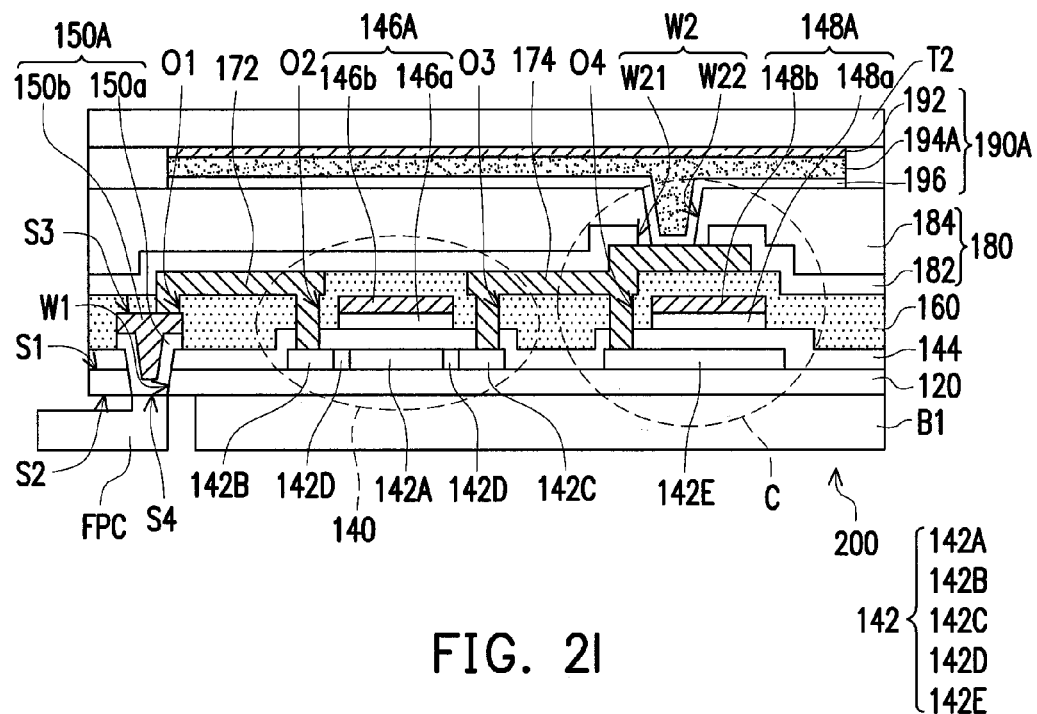

Moreover, as shown in FIG. 2G, the display device 190A of the embodiment is employed a liquid crystal display device for illustration. Specifically, the display device 190A of the embodiment includes an opposite electrode 192, a pixel electrode 196 and a display medium layer 194A located between the opposite electrode 192 and the pixel electrode 196, where the display medium layer 194A of the embodiment is a liquid crystal layer, for instance.

In the embodiment, the active element 140, the display device 190A and the pad 150A are fabricated on the carrier substrate (such as the glass substrate), and thus the afore-described devices are not restricted by the process temperature during the manufacturing processes, and have preferable device characteristics. Furthermore, the stress caused by the difference between the thermal expansion coefficients may not exist on the plastic substrate in the embodiment, such that the flexible display panel 200 of the embodiment is capable of having a preferable reliability and a preferable yield. Moreover, since the active element 140 and the pad 150A are fabricated on the buffer layer 120 and the buffer layer 120 is separated from the carrier substrate 110 through the laser lift-off process, issues such as the adhesive force and the stress between the flexible substrate and the carrier substrate can be neglected during release, and the occurrences of crack or disconnection due to the stress can be avoided, thereby further enhancing the manufacturing yield of the flexible display panel 200. Moreover, the pad 150A is exposed after releasing from the carrier substrate 110, which can be connected to the signal transmission circuit FPC directly. As such, besides the manufacturing yield affected by adhering and tearing off the conventional protective film repeatedly can be improved, the manufacturing method of the flexible display panel 200 in the embodiment can have a relatively simplified manufacturing procedure.

According to the above descriptions, the active element, the display device and the pad are fabricated on the carrier substrate in the embodiments of the disclosure, and thus the afore-described devices are not restricted by the process temperature during the manufacturing processes. Additionally, since the flexible display panel is connected to the signal transmission circuit after releasing from the carrier substrate during the manufacturing process thereof, the issue related to the signal transmission circuit peeling from the flexible display panel can be prevented while releasing, such that the flexible display panel has a preferable reliability. Moreover, in the disclosure, the pad is exposed after releasing from the carrier substrate, which can be connected to the signal transmission circuit directly in the manufacturing method of the flexible display panel. Thus, the manufacturing method of the flexible display panel has a relatively simplified manufacturing procedure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a flexible display panel, comprising:
    forming a release layer on a carrier substrate;
    forming a buffer layer on the release layer;
    forming an active element on the buffer layer;
    forming a pad in the buffer layer during the formation of the active element, wherein the pad is electrically connected to the active element, and the formation of the pad comprises:
        forming a first contact hole in the buffer layer; and
        filling a conductive material into the first contact hole so as to form the pad in the first contact hole;
    forming a display device electrically connected to the active element on the active element, wherein the display device comprises a pixel electrode, an opposite electrode and a display medium layer located between the pixel electrode and the opposite electrode;
    removing the release layer to separate the buffer layer from the carrier substrate and to expose the pad; and
    electrically connecting the pad to a signal transmission circuit.

2. The manufacturing method of the flexible display panel according to claim 1, wherein before removing the release layer, the pad is in contact with the release layer.

3. The manufacturing method of the flexible display panel according to claim 1, before forming the display device, further comprising:
    forming an insulating layer on the active element, wherein the insulating layer has a second contact hole, and the active element is electrically connected to the display device via the second contact hole.

* * * * *